(12) United States Patent
Kim

(10) Patent No.: US 6,674,123 B2
(45) Date of Patent: Jan. 6, 2004

(54) MOS CONTROL DIODE AND METHOD FOR MANUFACTURING THE SAME

(75) Inventor: Ho-hyun Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 40 days.

(21) Appl. No.: 10/059,937

(22) Filed: Jan. 28, 2002

(65) Prior Publication Data

US 2002/0088989 A1 Jul. 11, 2002

Related U.S. Application Data

(62) Division of application No. 09/151,173, filed on Sep. 10, 1998.

(30) Foreign Application Priority Data

Sep. 10, 1997 (KR) ............................................. 97-46540

(51) Int. Cl.$^7$ ................................................ H01L 29/76
(52) U.S. Cl. ...................... 257/328; 257/329; 257/330; 257/109; 257/288
(58) Field of Search ................................. 257/328, 329, 257/330, 332, 333, 412, 413, 109, 288

(56) References Cited

U.S. PATENT DOCUMENTS

| | | | | |
|---|---|---|---|---|
| 4,568,958 A | * | 2/1986 | Baliga | 257/332 |
| 5,049,956 A | * | 9/1991 | Yoshida et al. | 257/317 |
| 5,430,315 A | * | 7/1995 | Rumennik | 257/331 |
| 5,558,313 A | * | 9/1996 | Hseieh et al. | 257/342 |
| 5,614,749 A | * | 3/1997 | Ueno | 257/330 |
| 5,621,232 A | | 4/1997 | Ohno | 257/288 |
| 5,689,128 A | * | 11/1997 | Hseieh et al. | 257/331 |
| 5,883,411 A | * | 3/1999 | Ueda et al. | 257/331 |
| 5,978,258 A | | 11/1999 | Manning | 365/175 |

FOREIGN PATENT DOCUMENTS

| | | | | |
|---|---|---|---|---|
| GB | 2 089 118 | * | 6/1982 | H01L/29/78 |
| JP | 54-112179 | | 9/1979 | |
| JP | 4-02-146775 | * | 6/1990 | 257/331 |
| JP | 4-02-230765 | * | 9/1990 | 365/175 |
| JP | 4-03-109775 | * | 5/1991 | 257/332 |
| JP | 4-03-219677 | * | 9/1991 | 257/332 |
| JP | 4-04-093084 | * | 3/1992 | 257/330 |
| JP | 4-04-162573 | * | 6/1992 | 257/330 |
| JP | 4-338678 | | 11/1992 | |
| JP | 4-05-335582 | * | 12/1993 | 257/329 |
| KR | 1997-54348 | | 7/1997 | |

OTHER PUBLICATIONS

B. Jayant Baliga, Power Semiconductor Devices, PWS Publishing Company, 1996, pp. 336–343.*
Translation of Korean Publication No. 1997–54348.

* cited by examiner

Primary Examiner—George Eckert
(74) Attorney, Agent, or Firm—Marger Jognson & McCollom, P.C.

(57) ABSTRACT

A MOS control diode is provided for power switching. In the MOS control diode, a switching speed is high and a reverse leakage current characteristic is improved without additionally needing processes for improving reverse recovery time by converting a power MOSFET which is a majority carrier device to diode having two terminals. Such a MOS control diode can be achieved by forming a discontinuous area in a gate oxide film formed on the surface of a semiconductor substrate so that the conductive gate electrode is connected to the semiconductor substrate. Also, it is possible to form a trench in the semiconductor substrate, to form the gate oxide films on the sidewall of a trench, and to connect the gate electrode to the semiconductor substrate through the bottom of the trench.

21 Claims, 6 Drawing Sheets

MOS CONTROL DIODE AND METHOD FOR MANUFACTURING THE SAME

This application is a divisional of U.S. patent application Ser. No. 09/151,173, filed on Sep. 10, 1998, now pending, which is herein incorporated by reference in its entirety.

BACKGROUND OF THE INVENTION

1. Field of the Invention

The present invention relates to a power device, and more particularly, to a MOS control diode having two electrodes and a method for manufacturing the same.

2. Description of Related Art

A semiconductor device can be used not only for processing information or signals but also controlling the currents or power of an electrical circuit or an electronic circuit. The device used for controlling the power is called a power device in order to distinguish it from other signal processing devices. The power device has a vertical structure in which an area through which a current flows is wide and a withstand voltage is easily amplified in order to control large power. Such a vertical structure is completely different from the signal processing device, which conventionally has a lateral structure.

As electronic equipments require high function and high degree of efficiency, a miniaturizable switching source of electric power is required. Also, a diode having little switching loss has been generally required as the switching source of electric power. Impurities such as Au or Pt are doped into PN junction or particles such as electrons and protons are irradiated into the silicon substrate adjacent the PN junction to provide recombination centers. By controlling minority carrier lifetime, a reverse recovery time (Trr) characteristic of the current in a PN junction diode is improved, and thus high-speed switching of the electric power switching source is realized. However, the above doping or irradiating method has shortcomings in that manufacturing processes are difficult, expensive and increase reverse leakage current.

If a Schottky diode using a conventional Schottky barrier is used as a switching source of electric power, high-speed switching can be achieved without additional processes for increasing the Trr. A minority carrier storage effect does not exist in the Schottky diode operating by a majority carrier. However, the Schottky diode has shortcomings in that a reverse voltage is low and a reverse current is large.

Therefore, recently, there has been an attempt to realize the high speed switching using a metal oxide semiconductor field effect transistor (MOSFET) which is the majority carrier device. Research on this device is described in pages 336 through 343 of Power Semiconductor Devices published in 1996 by PWS Publishing company, a division of Thomson Publishing Inc. and written by B. JAYANT BALIGA.

In the case of constructing the switching device by three terminals comprised of a source, a drain, and a gate electrode like the power MOSFET, high speed switching can be realized. However, a desirable degree of integration of the switching device having three terminals is hard to be realized and a power circuit adopting such MOSFET switching device becomes complicated.

SUMMARY OF THE INVENTION

The present invention is a MOS control diode in which a switching operation is very fast and a reverse leakage current is lowered by contacting a gate electrode of a MOSFET with drain area, thereby converting a MOSFET which is a majority carrier device to MOS diode having two terminals.

Another aspect of the present invention is a method for manufacturing the MOS control diode.

A MOS control diode according to a first embodiment of the present invention includes a semiconductor substrate having a first conductive type as a drain area. A gate oxide film or layer is formed on a surface of the semiconductor substrate with a discontinuous area in the middle of the oxide layer, thus giving the oxide layer a disconnected shape. A gate electrode is connected to the semiconductor substrate through the discontinuous area of the gate oxide film. A base well area having a second conductive type is formed around the semiconductor substrate below the gate oxide film having a disconnected shape, and a source well area having a first conductive type is formed in the base well area.

The MOS control diode according to the first embodiment of the present invention preferably further includes an insulating film formed to cover the entire exposed surface of the gate electrode, a conductive source electrode formed on the source well area, connected to the source area, and covering the entire semiconductor substrate, and a conductive drain electrode formed on the backside of the semiconductor substrate. Preferably, the gate electrode is a composite layer of a polysilicon layer and a metal layer. The first and second conductive types can be N and P types, respectively.

A trench type MOS control diode according to a second embodiment of the present invention includes a semiconductor substrate having a first conductive type as a drain area, a base well area having a second conductive type preferably formed by performing a first ion implantation in the semiconductor substrate, and a source well area having a first conductive type formed in the second conductive base well area preferably by a second ion implantation. A gate electrode insulated from the base well area and the source well area and burying the trench formed by etching the semiconductor substrate. An insulating film is formed on the semiconductor substrate to cover the entire top side of the gate electrode and to expose a part of the source well.

Preferably, the trench type MOS control diode further includes a source electrode formed on the exposed source well and the insulating film so as to cover the entire semiconductor substrate.

According to a preferred embodiment of the present invention, the trench type MOS control diode further includes gate oxide films formed on the sidewall of the gate electrode and a drain electrode formed on a backside of the semiconductor substrate.

Preferably, the trench is formed by etching the semiconductor substrate to a depth which is deeper than the base well area is formed. Also, the gate electrode is preferably formed of a composite layer consisting of a polysilicon layer formed on the sidewall of the trench to have a certain thickness and a metal layer which completely buries the trench.

In a method for manufacturing a MOS control diode according to the first embodiment of the present invention, a gate oxide film is formed on a semiconductor substrate having a first conductive type to have a discontinuous area in the middle of the layer, thus having a disconnected shape. A gate electrode contacting the semiconductor substrate through the discontinuous area is formed on the gate oxide film. A base well area having a second conductive type is formed on the semiconductor substrate by performing a first ion implantation using the gate electrode as a mask. A source well area having a first conductive type is formed in the base well area by performing a second ion implantation. An insulating film enclosing the entire gate electrode is formed. A source electrode connected to the source well area and covering the top side of the semiconductor substrate is formed on the resultant structure. Fabrication of the MOS control diode according to the first embodiment of the present invention is completed by forming a drain electrode on backside of the semiconductor substrate.

In a method for fabricating a trench type MOS control diode according to a second embodiment of the present invention, a base well area having a second conductive type is formed by performing a first ion implantation to a semiconductor substrate having a first conductive type. A source well area having a first conductive type is formed in the base well area by performing a second ion implantation. A trench is formed so that a part of the semiconductor substrate is etched to be deeper than the base well area in the semiconductor substrate. Gate oxide films are formed on the sidewalls of the trench. Gate electrodes for burying the trench are formed.

According to a preferred embodiment of the present invention, the trench and the gate electrode including the gate oxide film are preferably plural.

In a method for forming the gate electrode, a polysilicon layer is formed on the sidewall and the bottom of the trench to have a certain thickness. A conductive material for completely burying the trench is stacked on the polysilicon layer. The conductive material is etched back so that the semiconductor substrate is exposed. Also, it is preferable that an insulating film is formed on the semiconductor substrate on which the gate electrodes are formed so as to expose a part of the source well area and to cover the entire top side of the gate electrode, and then a source electrode is formed on the exposed source well and the insulating film. It is preferable that a drain electrode is additionally formed on the backside of the semiconductor substrate.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

First Embodiment

The structure and the operating principle of a MOS control diode according to a first embodiment of the present invention are described with reference to FIGS. 1 through 3.

Figure 1:
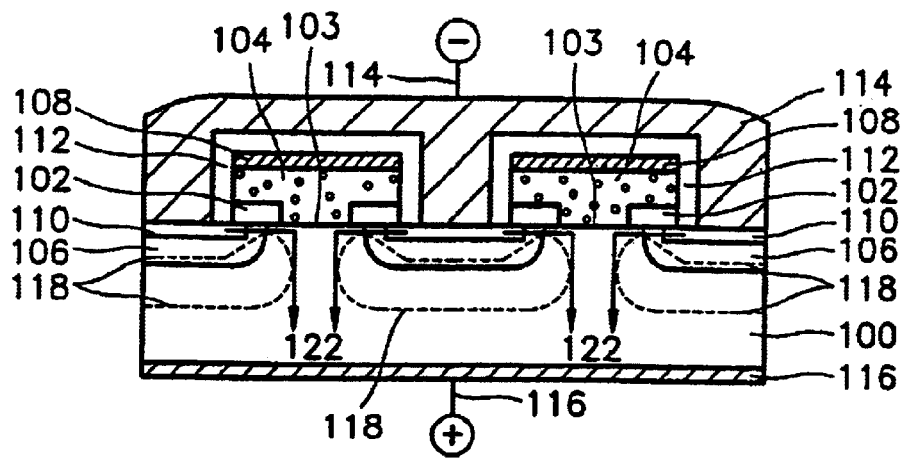
FIGS. 1 through 3 are sectional views showing the structure and the operating principle of a MOS control diode according to a first embodiment of the present invention.

FIG. 1 is a sectional view showing that a forward bias is applied by respectively applying a minus source and a plus source to a source electrode 114 and a drain electrode 116 of the MOS control diode according to the present invention.

The MOS control diode according to the first embodiment of the present invention includes an N type semiconductor substrate 100 used as a drain area. A gate oxide film 102 formed on the surface of the semiconductor substrate 100 to have a discontinuous area 103 in the middle of the film, thus giving the film a disconnected shape. A gate electrode constructed by a composite layer preferably consisting of a polysilicon layer 104 directly contacting the semiconductor substrate 100 through the discontinuous area of the gate oxide film 102 and a conductive layer 108 such as Al. A P type body or base well area 106 is formed in the semiconductor substrate 100 below the gate oxide film 102, and an N type source well area 110 is formed in the P type base well area 106.

Also, an insulating film 112 formed of boron phosphorus silicate glass (BPSG) or phosphorus silicate glass (PSG) encloses the gate electrodes 104 and 108. A source electrode 114 formed of a conductive material such as Al is connected to the source well area 110 and covers the semiconductor substrate 100. A drain electrode 116 formed of a conductive material, such as Al, covers the backside of the semiconductor substrate 100.

The gate electrode consisting of polysilicon layer 104 and the conductive layer 108 is connected electrically to the drain area which is the semiconductor substrate 100 through the discontinuous area 103 formed in the middle of the gate oxide film 102.

Such a structure enables a two terminal diode to function substantially as the MOSFET having three terminals. The source area 110, the base well area or body 106, and the lower semiconductor substrate or drain 100 form an NPN structure when a minus voltage is applied to the source electrode 114 and that a plus voltage is applied to the drain electrode 116, the plus voltage applied to the drain electrode 116 is transmitted to the gate electrode 104 and 108 through the semiconductor substrate 100.

Therefore, a switching operation is performed because a channel is generated in the P-type body underlying of the gate oxide film 102, caused by the electric field emanating downward from the gate electrode 104. Thus, a flow 122 of electrons is generated through the channel due to the difference of electrical potential between the source electrode 114 and the drain electrode 116. Here, reference numeral 118 denotes depletion layers formed on the boundary of the base well area 106 when a forward bias is applied.

Figure 2:
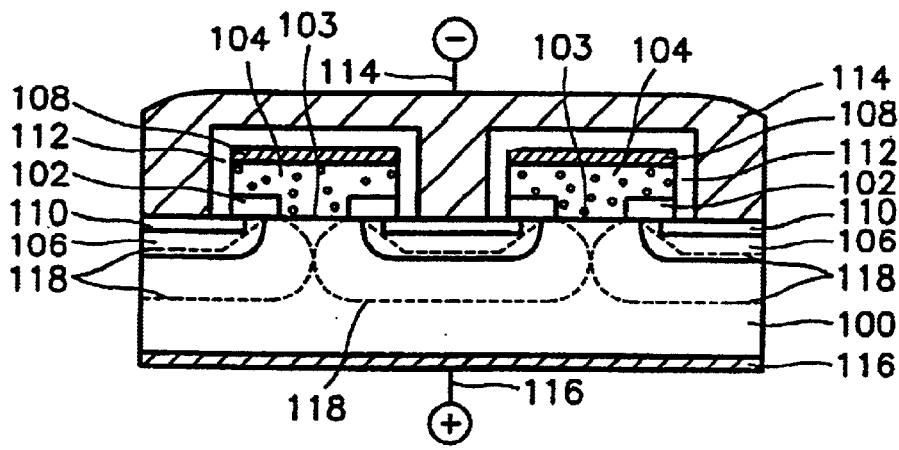

FIG. 2 is a sectional view showing a pinch off state in which the depletion layers 118 come in contact when the forward bias voltage applied to the source electrode 114 and the drain electrode 116 is increased from that illustrated in FIG. 1. The current increases no more and saturates in the pinch-off state.

Figure 3:
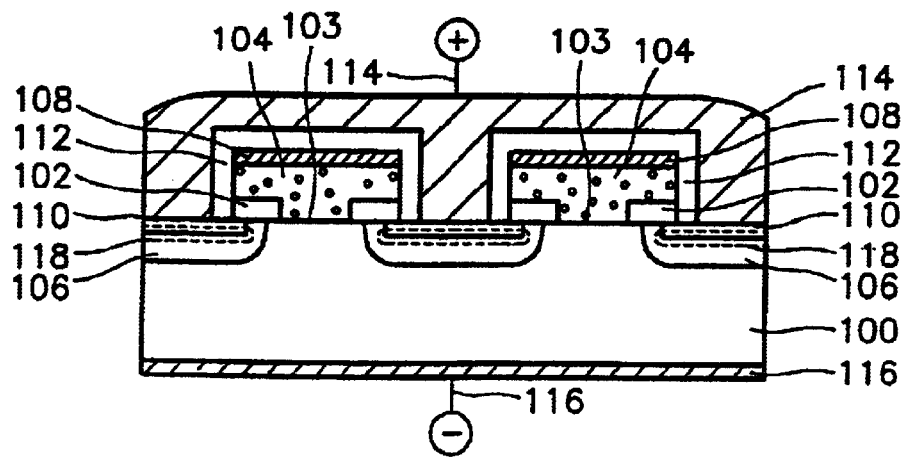

FIG. 3 is a sectional view showing that a plus voltage and a minus voltage are respectively connected to the source electrode 114 and the drain electrode 116, such that a reverse bias is applied thereto. At this time, the depletion layers 118 are formed on the boundary between the N-type source well area 110 and the P type base well area 106. Therefore, leakage current can be reduced by not forming a channel under the oxide layer 102 through which the current could flow. Increasing the reverse bias voltage between terminals 116, 114 increases the reverse field between the gate electrode and the P type well 106 across oxide layer 102, enhancing the blocking effect.

A method for manufacturing a MOS control diode according to the first embodiment of the present invention will be described with reference to FIGS. 4 through 7.

Figure 4:
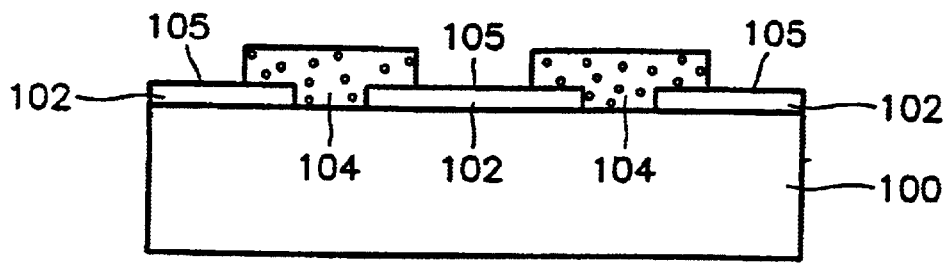
FIGS. 4 through 7 are sectional views showing a method for manufacturing the MOS control diode according to the first embodiment of the present invention.

Referring to FIG. 4, an oxide film is formed on a first conductive N type semiconductor substrate 100 used as the drain area, to a thickness of 1,000 through 2,000 Å. Then, a discontinuous area 103 is formed in the middle of the gate oxide film 102 by patterning the oxide film using photolithography processes. The gate electrode is formed by depositing a doped polysilicon layer 104 over the oxide layer and contacting the semiconductor substrate in the discontinuous area 103. Then, openings are formed to expose areas 105 of the oxide layer 102 spaced between areas 103 by patterning the polysilicon layer.

Figure 5:
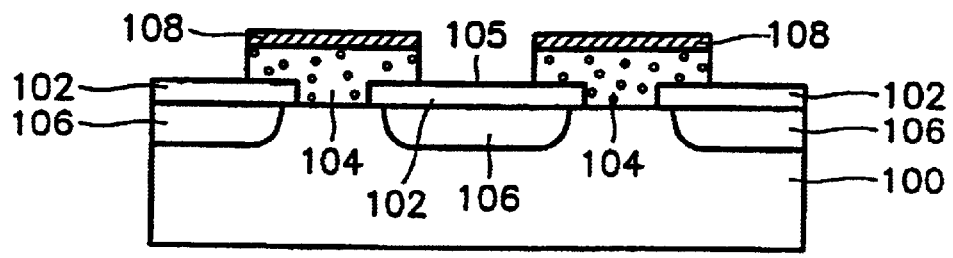

Referring to FIG. 5, the P type base well area 106 is formed in the semiconductor substrate 100 by a first step of ion implanting impurities such as boron which is a second conductive P type impurities. At this time, the gate electrode is preferably used as an ion implanting mask. The preferred gate electrode composite structure consisting of the polysilicon layer 104 and the conductive layer 108 is formed by stacking the conductive layer such as Al layer 108 on the polysilicon layer, after the first impurity implantation step, by sputtering and patterning the conductive layer so that conductive layer 108 remains only on the polysilicon layer 106.

Figure 6:
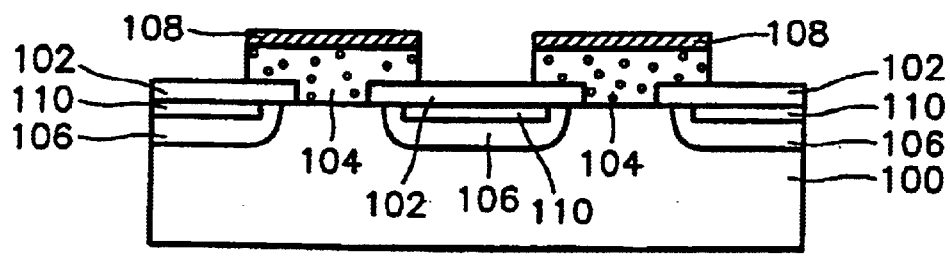

Referring to FIG. 6, a source well area 110 is formed in the base well area 106 by a second step of ion implanting N+ type impurities such as phosphorus having a high density. The resultant structure on which the gate electrodes 104 and 108 are formed includes the source well area 110, the base well area 106, and the semiconductor substrate 100, which together form an NPN structure.

Figure 7:
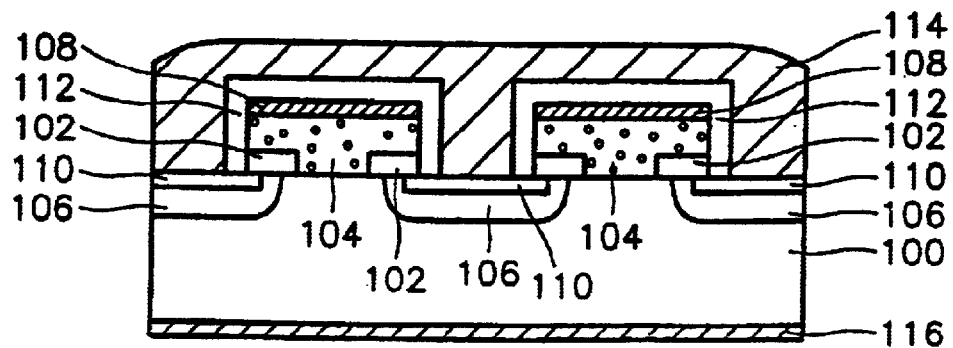

Referring to FIG. 7, the gate oxide film 102 in the exposed areas 105 (that is, excluding the areas under the gate electrode) is completely removed by etching, with the resultant exposure of the source well area 110 between the gate contacts. An insulating film 112 such as BPSG or PSG film is then deposited by a chemical vapor deposition (CVD) method. The insulating film 112 is patterned and etched so as to enclose the gate electrode constructed by the composite layer of the polysilicon layer 104 and the Al layer 108 while exposing the silicon substrate surface over source well area 110. The source electrode 114 is formed by depositing a conductive material such as an Al layer on the exposed semiconductor substrate in area 110 and over the insulating film 112. At this time, the source electrode 114 is connected ohmically to the source well area 110. The process of fabricating the MOS control diode according to the first embodiment of the present invention is completed by forming the drain electrode 116. The drain electrode 116 is formed by depositing a conductive material such as an Al layer on the backside of the semiconductor substrate 100 which substantially functions as the drain area.

Second Embodiment

First, the structure and the operating principle of a trench type MOS controller diode according to the second embodiment of the present invention are described with reference to FIGS. 8 and 9. The reference numerals having the same tens-place number as those of the first embodiment refer to like elements.

Figure 8:
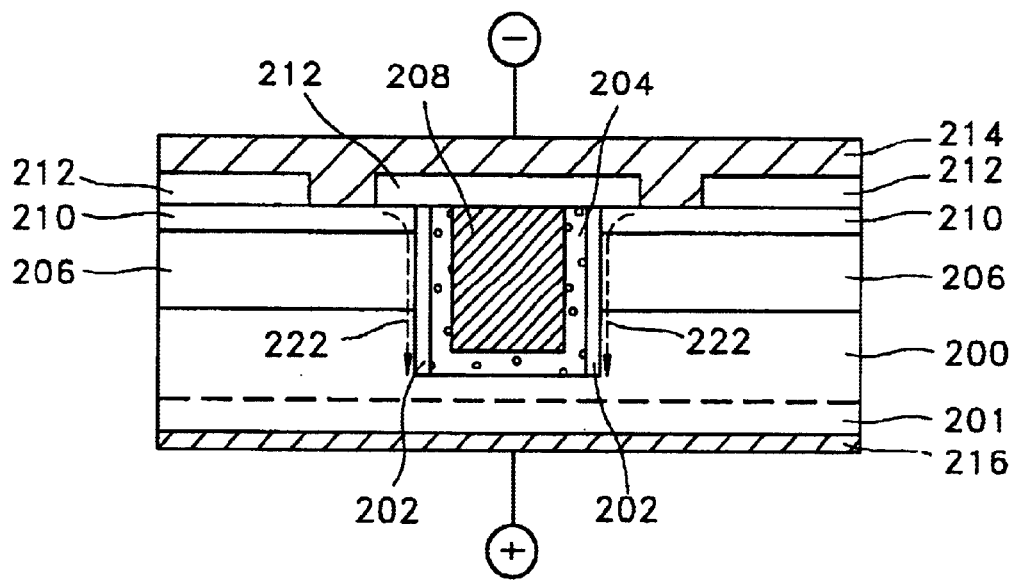
FIGS. 8 and 9 are sectional views describing the structure and the operating principle of a trench type MOS control diode according to a second embodiment of the present invention.

FIG. 8 is a sectional view showing the structure of the trench type MOS control diode according to the second embodiment of the present invention. In the MOS control diode according to the above mentioned first embodiment, a switching operation is very fast and a reverse leakage current can be reduced. However, it has a shortcoming in that a forward voltage drop is heightened since a channel through which the electrons flow is formed around the oxide film. The trench type MOS control diode which will be described below solves the above problem.

The trench type MOS control diode according to the second embodiment of the present invention includes an N type semiconductor substrate 200 as a drain area, a base well area 206 formed by a first ion implanting P type impurities into the semiconductor substrate 200, and a source well area 210 formed by a second ion implanting N+ impurities in the base well area 206. A gate electrode is constructed by a composite layer consisting of a polysilicon layer 204 and a conductive layer 208 such as an Al layer which fill a trench 220 (FIG. 11) formed by etching the semiconductor substrate 200. A gate oxide film 202 is formed in the trench on each sidewall of the gate electrodes 204 and 208. An insulating film 212 formed of an oxide film covers the upper portion of the gate electrode and exposes some of the source well area 210. A source electrode 214 formed of a conductive material contacts the exposed source well area 210 and extends over the insulating film 212. A drain electrode 216 is formed of a conductive material such as Al on backside of the semiconductor substrate 200. Here, reference numeral 201 denotes an N+ area in which the concentration of the N type impurities is relatively higher than concentration in the semiconductor substrate 100.

In the trench type MOS control diode, the gate electrodes 204 and 208 are not insulated from the drain area 200 which is the semiconductor substrate 200 by the gate oxide film 202 unlike in a conventional technology but are directly connected to the drain area 200 through the bottom of the trench. Therefore, when minus and plus voltages are respectively applied to the source electrode 214 and the drain electrode 216, respectively, thereby applying a forward bias to the device, the positive voltage applied to the drain electrode 216 is transmitted to the gate electrodes 204 and 208. A flow 222 of electrons is generated through the channel formed by depletion of area 206 along oxide layer 202, thus performing the switching operation. Conversely, when a reverse bias is applied, the channel through which the electrons flow is not formed. Accordingly, the leakage current is effectively blocked. Therefore, in such a trench type MOS control diode, the switching operation is very fast and the reverse current is very low since the MOSFET, which is a majority carrier device, is modified to be used as the switching diode having two terminals. Accordingly, it is possible to reduce the leakage current. Furthermore, in the structure of the trench type gate electrodes 204 and 208, it is possible to lower the forward voltage since the channel is not formed around the gate oxide film 202 but straightly formed. Also, the integrity can be heightened.

Figure 9:
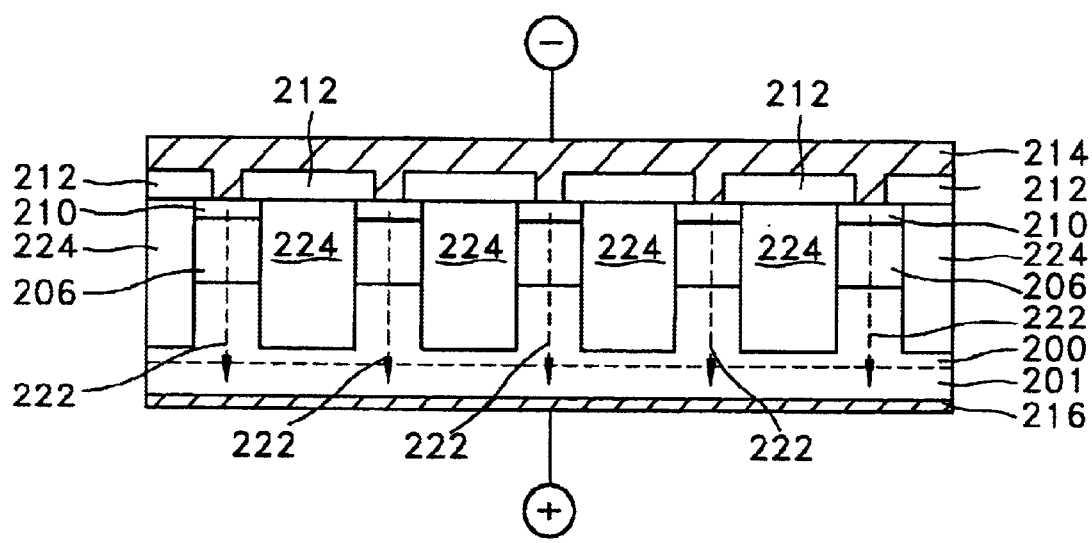

FIG. 9 is a sectional view showing that MOSFET device have a plurality of trenches. Each trench is filled with gate oxide film and gate electrode as depicted in FIG. 8. Here, reference numeral 224 denotes a trench including a gate oxide film, a polysilicon layer, and an Al layer collectively. The plurality of gate electrodes in the plurality of trenches 224 generate a plurality of straight current paths and thus lower the forward voltage drop of the MOSFET device. Therefore, the forward voltage which is feasible to be heightened in order to realize a high switching and to reduce the reverse leakage current may be effectively lowered. The remaining reference numerals are omitted since they are the same as those described in FIG. 8.

A method for manufacturing a trench type MOS control diode according to the second embodiment of the present invention will be described with reference to FIGS. 10 through 14.

Figure 10:
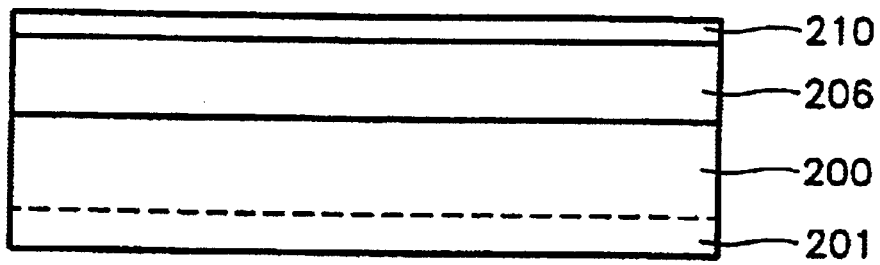
FIGS. 10 through 14 are sectional views describing a method for manufacturing the trench type MOS control diode according to the second embodiment of the present invention.

Referring to FIG. 10, the body layer or base well area 206 is formed by a first ion implanting P type boron impurities in the N type semiconductor substrate 200. The $N^+$ source well area 210 is formed on the base well area 206 by a second ion implanting the N type impurities such as phosphorus. Here, reference numeral 201 denotes an $N^+$ area in which the density of the N type impurities is relatively high in the semiconductor substrate 200 used as the drain area. As an alternative to ion implantation, any areas 201, 206, and 210 can be formed as epitaxial layers on a substrate 200.

Figure 11:
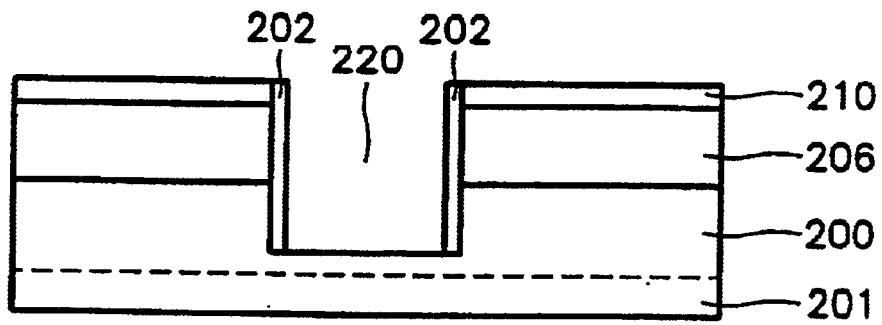

Referring to FIG. 11, a trench 220 is formed in a semiconductor substrate 200 by coating photoresist and performing photolithography and etching processes. At this time, the trench 220 is formed to a depth extending through the base well area 206 and into the semiconductor substrate 200. Then, an oxide film to be used as a gate oxide film is formed over all surfaces of the semiconductor substrate 200 including sidewalls of the trench 220. Next, the oxide film on the bottom of the trench 220 and the upper surface of the semiconductor substrate 200 is removed by reactive ion etching(RIE). Therefore, the gate oxide film 202 remains only on the side walls of the trench 220.

Figure 12:
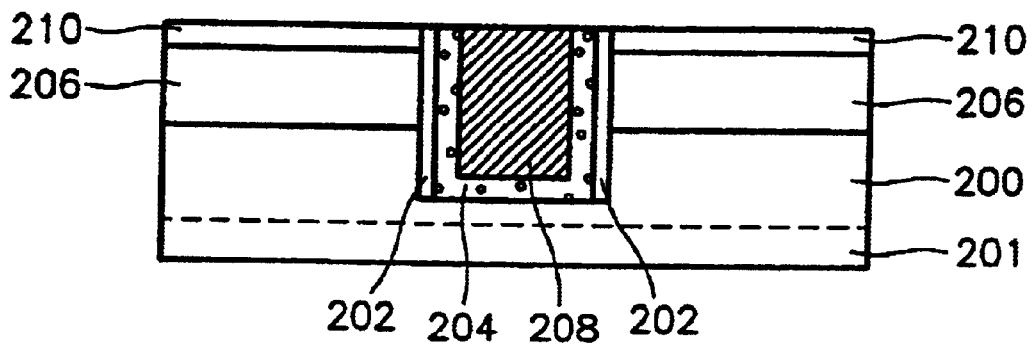

Referring to FIG. 12, the trench is completely filled by first depositing the polysilicon layer 204 on the semiconductor substrate 200 on which the gate oxide film 202 is formed and then depositing the conductive layer 208 such as the Al layer thereon in an appropriate thickness. The gate electrode filling the trench is formed by etching back the polysilicon layer 204 and the conductive layer 208 to expose the top surface of the substrate.

Figure 13:
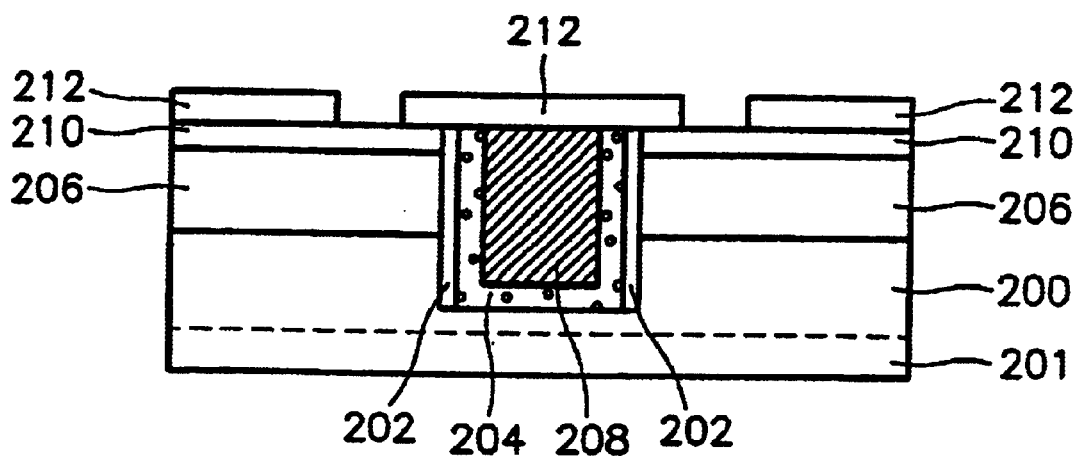

Referring to FIG. 13, the insulating film 212 is formed by depositing an oxide film on the semiconductor substrate and over the gate electrode formed by the composite layer of the polysilicon layer 204 and the conductive layer 208. The insulating film 212 is then patterned and etched so that the patterned insulating film covers all over the top side of the gate electrode and exposes some of the source well area 210 at the substrate upper surface.

Figure 14:
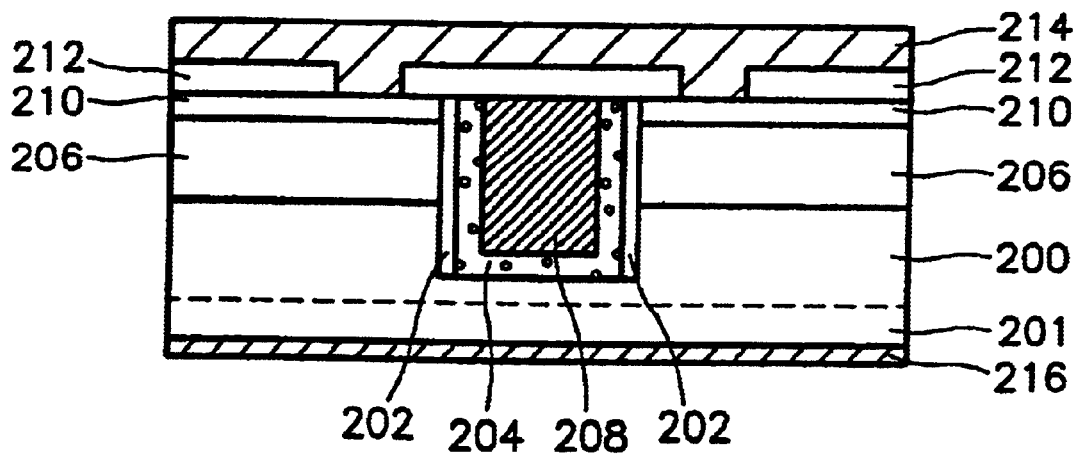

Referring to FIG. 14, the source electrode 214 is formed by depositing a layer of conductive material such as Al on the top side of the semiconductor substrate on which the insulating film 212 is formed, in electrical contact with exposed areas 210. The process of forming the trench type MOS control diode according to the second embodiment of the present invention is completed by depositing the conductive material on the backside of the semiconductor substrate 200 used as the drain area, thus forming the drain electrode 216.

Figure 15:
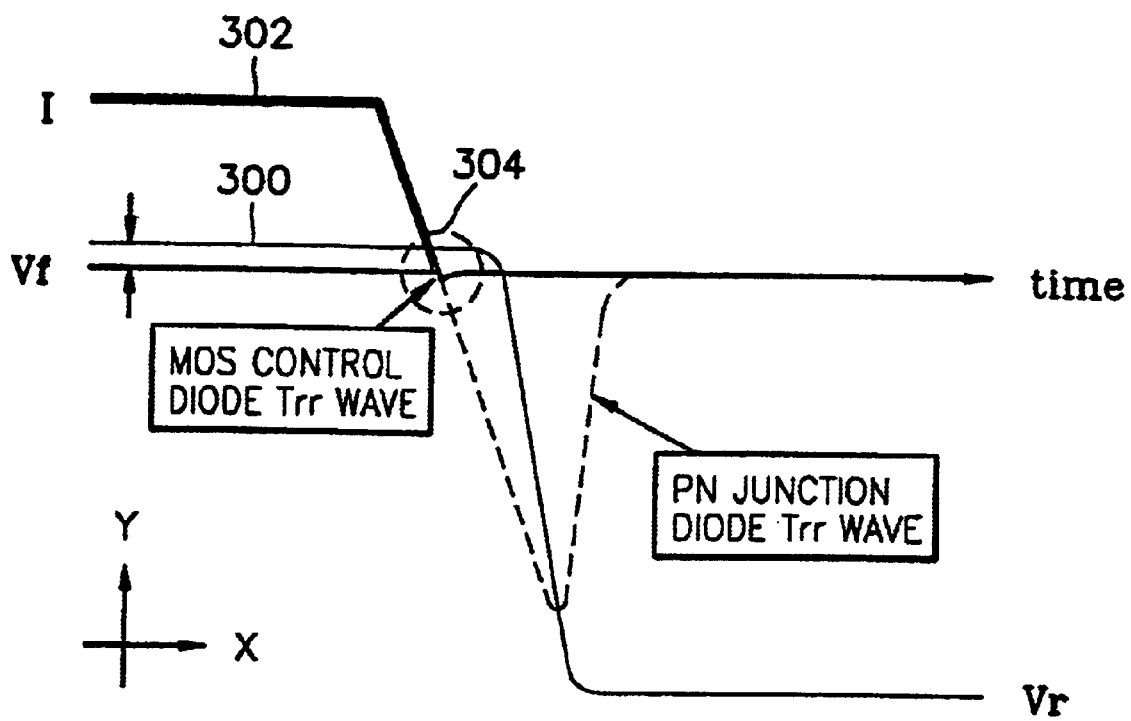
FIG. 15 describes the reverse recovery time of the current of a conventional PN junction diode and the MOS control diode according to the present invention.

FIG. 15 shows the reverse recovery time Trr of a conventional PN junction diode compared to that of the MOS control diode according to the present invention. In FIG. 15, the Y axis denotes the level of the voltage and current and the X axis denotes time. Reference numeral 300 denotes the waveform of the voltage. Reference numeral 302 denotes the waveform of the current. In the case of the conventional PN junction diode, when the forward bias is applied, the forward current (If) flows during a forward voltage fall (Vf). When the reverse bias (Vr) is applied, a Trr section (marked with a dashed line) in which the reverse current flows is generated, due to a time delay in recombination of minority carriers. However, since the MOS control diode according to the present invention is operated by the majority carrier according to the operating principle, a Trr delay phenomenon (304) due to the minority carrier storage effect does not exist, and if it exists, it is very slight.

Therefore, according to the above-mentioned present invention, it is possible to realize a MOS control diode in which high speed power switching operation can be performed and the reverse leakage current can be reduced without performing additional processes for improving the Trr characteristic by transforming the power MOSFET which is the majority carrier device into a diode having two terminals.

The present invention is not restricted to the above-mentioned embodiments and many variations are possible within the scope and spirit of the present invention by anyone skilled in the art. For example, the oppositely-doped well areas could be formed by epitaxial deposition of oppositely-doped layers on the semiconductor substrate. I claim all modifications and variation coming within the spirit and scope of the following claims.

What is claimed is:

1. A two-terminal MOS control trench type diode having first and second diode terminals, the diode comprising:
    a semiconductor substrate having a first conductive type as a drain area;
    a base well area having a second conductive type electrically coupled to the drain area, the drain area coupled to the first diode terminal;
    a source well area having the first conductive type formed on the base well area, the source well area coupled to the second diode terminal;
    a trench extending through the source well area, the base well area and a part of the semiconductor substrate; and
    a floating conduction facilitating structure formed in the trench, insulated from the base well area, and directly coupled to the substrate, the conduction facilitating structure physically separated from both the first and second terminals.

2. The two-terminal trench type MOS control diode of claim 1, wherein the conduction facilitating structure is insulated from the base well area and the source well area by a gate oxide film formed on a sidewall of the trench.

3. The two-terminal trench type MOS control diode of claim 1, further comprising, an insulating film formed on the semiconductor substrate so as to cover the entire top side of the conduction facilitating structure and to expose some of the source well; and
    a source electrode formed on the exposed source well and the insulating film so as to cover the semiconductor substrate.

4. The two-terminal trench type MOS control diode of claim 1, wherein the conduction facilitating structure is formed of a composite layer consisting of a polysilicon layer formed on the sidewall and the bottom of the trench to a predetermined thickness and a metal layer which fills the trench.

5. The two-terminal trench type MOS control diode of claim 3, wherein the insulating film is formed of $SiO_2$.

6. The two-terminal trench type MOS control diode of claim 1, wherein a plurality of conductive facilitating structures are respectively formed in a plurality of trenches.

7. The two-terminal trench type MOS control diode of claim 1, further comprising a drain electrode formed on a backside of the semiconductor substrate.

8. The two-terminal trench type MOS control diode of claim 1, wherein the first conductive type is N type and the second conductive type is P type.

9. A trench type control diode formed in a semiconductor substrate having a trench formed therein, the control diode comprising:
- a first terminal coupled to the substrate;
- a floating electrode formed in the trench and in contact with the substrate, the floating electrode free from electrode contacts;
- a source well formed in the substrate; and
- a second terminal coupled to the source well.

10. The control diode of claim 9 wherein the floating electrode comprises two components.

11. The control diode of claim 10 wherein one of the two components comprises polysilicon.

12. The control diode of claim 10 wherein one of the two components comprises a metal.

13. The control diode of claim 9 wherein the trench has two substantially vertical sides, and a substantially horizontal bottom.

14. The control diode of claim 13, further comprising an insulating material separating the sides of the trench from the substrate.

15. The control diode of claim 9, wherein the floating electrode substantially fills the trench.

16. The control diode of claim 9, further comprising a plurality of trenches formed in the substrate and a plurality of electrodes respectively formed in the plurality of trenches.

17. The control diode of claim 9 wherein the floating electrode completely fills the trench.

18. The control diode of claim 9 wherein the floating electrode is devoid of electrical terminations outside the diode device.

19. A two-terminal semiconductor diode structure, comprising:
- a semiconductor substrate;
- a doped drain area formed in the substrate;
- a first diode terminal coupled to the drain area;
- a trench formed in the substrate;
- a conductive material substantially filling the trench and in contact with the substrate, the conductive material free from electrical terminations;
- a doped source area formed in the substrate, the source area separate from the drain area;
- an insulating layer covering the source well area and a top surface of the conductive material, the insulating layer having one or more contact holes formed therethrough; and
- a second diode terminal disposed on the insulating layer and through the one or more contact holes to contact the source area.

20. The semiconductor diode structure of claim 19, wherein the conductive material comprises a polysilicon portion and a metal portion.

21. The semiconductor diode structure of claim 19, wherein sidewalls of the trench include an insulating material.

* * * * *

UNITED STATES PATENT AND TRADEMARK OFFICE
CERTIFICATE OF CORRECTION

PATENT NO. : 6,674,123 B2
DATED : January 6, 2004
INVENTOR(S) : Kim

It is certified that error appears in the above-identified patent and that said Letters Patent is hereby corrected as shown below:

Title page,
Item [56], References Cited, U.S. PATENT DOCUMENTS, reads "5,558,313 A * 9/1996 Hseieh et al. … 257/342" should read -- 5,558,313 A * 9/1996 Hshieh et al. … 257/342 --.; and reads "5,689,128 A * 11/1997 Hseieh et al. … 257/331" should read -- 5,689,128 A * 11/1997 Hshieh et al. ...257/331 --.

Column 10,
Line 25, "claim 19, wherein" should read -- claim 19 wherein --.

Signed and Sealed this

Sixth Day of July, 2004

JON W. DUDAS
*Acting Director of the United States Patent and Trademark Office*